US005198701A

United States Patent [19]

Davies et al.

[11] Patent Number: 5,198,701

[45] Date of Patent: Mar. 30, 1993

[54] CURRENT SOURCE WITH ADJUSTABLE TEMPERATURE VARIATION

[76] Inventors: Robert B. Davies, 433 E. McKinley, Tempe, Ariz. 85281; Lloyd H. Hayes, 1064 W. Meseto Ave., Mesa, Ariz. 85210; David M. Heminger, 1322 W. Ellis St., Mesa, Ariz. 85201; David F. Mietus, 3501 S. McClintock, #1056, Tempe, Ariz. 85282

[21] Appl. No.: 632,793

[22] Filed: Dec. 24, 1990

[51] Int. Cl.[5] .......................... H03K 3/01; H03K 3/26

[52] U.S. Cl. ................................ 307/296.3; 307/270; 307/310

[58] Field of Search ............... 307/296.1, 296.4, 296.6, 307/270, 264, 491, 310, 311; 323/312, 315, 316; 338/8, 9, 907; 372/34

[56] References Cited

U.S. PATENT DOCUMENTS

| | | | |
|---|---|---|---|
| 3,793,522 | 2/1974 | Coleby et al. | 250/214 C |
| 4,242,598 | 12/1980 | Johnson et al. | 307/296.6 |
| 4,243,952 | 1/1981 | Patterson | 372/34 |
| 4,284,334 | 8/1981 | Magel | 323/907 |
| 4,313,082 | 1/1982 | Neidorff | 307/310 |
| 4,323,854 | 6/1982 | Hester | 307/310 |
| 4,604,568 | 8/1986 | Prieto | 323/907 |
| 4,694,157 | 9/1987 | Mishina | 307/311 |
| 4,719,405 | 1/1988 | Boucher | 323/902 |
| 4,724,339 | 2/1988 | Ishida | 307/355 |
| 4,868,485 | 9/1989 | Ashizaki | 323/907 |
| 4,963,727 | 10/1990 | Cova | 307/311 |
| 4,975,566 | 12/1990 | Uda | 307/311 |
| 5,045,683 | 9/1991 | Kanda | 250/214 C |

*Primary Examiner*—Jin F. Ng
*Assistant Examiner*—Sinh Tran
*Attorney, Agent, or Firm*—Michael A. Waters

[57] ABSTRACT

A current source with adjustable temperature compensation in which the level of current supplied to a load is adjusted to compensate for the load's inherent change in performance with changes in temperature. The current source allows selection of the appropriate temperature compensating characteristic and operating current solely by altering internal component values.

11 Claims, 1 Drawing Sheet

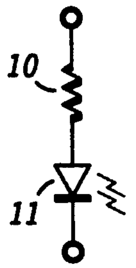
FIG. 1
-PRIOR ART-
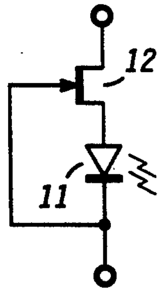
FIG. 2
-PRIOR ART-
FIG. 3
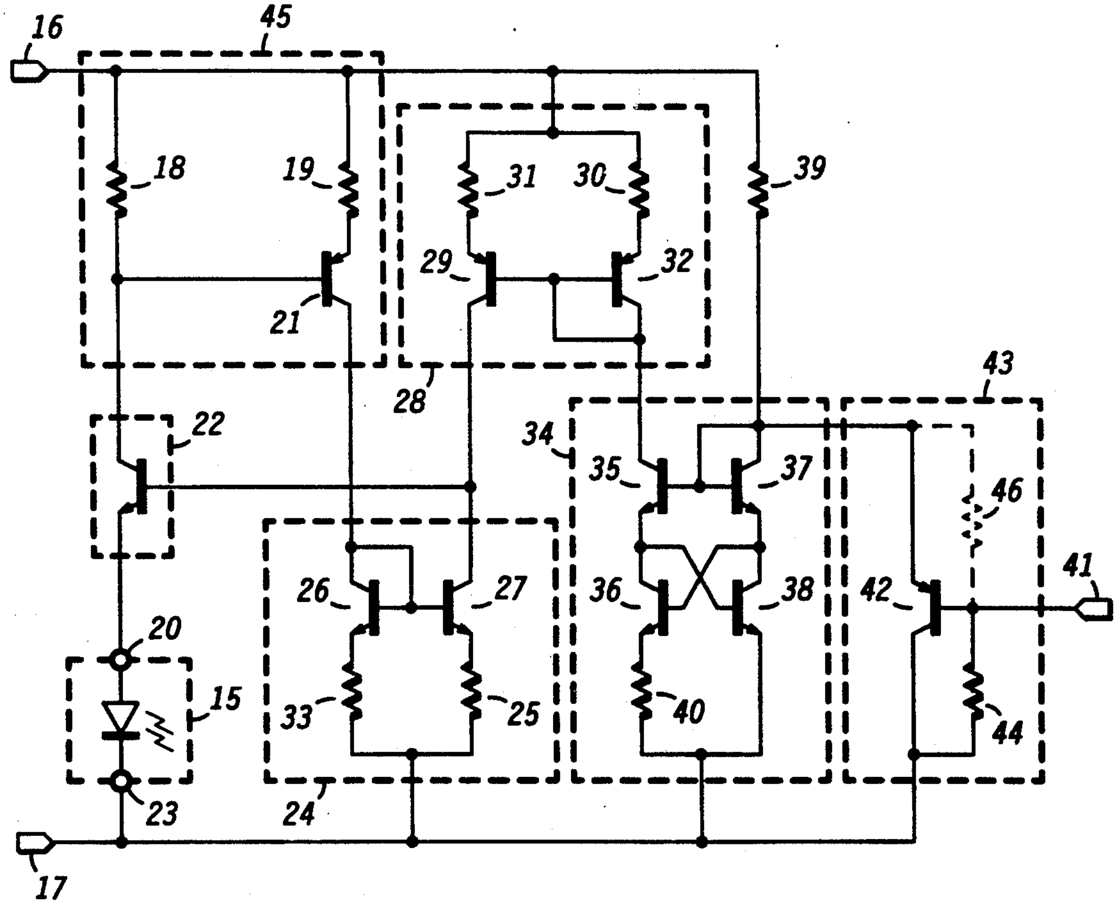

CURRENT SOURCE WITH ADJUSTABLE TEMPERATURE VARIATION

BACKGROUND OF THE INVENTION

The present invention relates, in general, to a current source with an adjustable temperature coefficient, and more particularly to a current source suitable for supplying a temperature compensated current to a load including, but not limited to an electro-optical device or system.

Many electro-optical systems require a constant light output intensity however the light output intensity will cause undesired performance changes in the system unless temperature compensation is used. Even if there is no other reason, temperature compensation of electro-optical devices is desirable to avoid excessive power dissipation in the optical source and its associated circuitry. In some systems the current required to ensure reliable operation at the lowest temperature will provide excessive current at the highest temperature causing further heating and eventual failure of the device.

Temperature compensation in most electronic circuits is achieved by means of electrical feedback from the ultimate output in some fashion. Electro-optical devices are among the devices in which electrical feedback is difficult to achieve, making such temperature compensation schemes impractical. Optically isolated devices are particularly difficult to compensate for temperature since they consist of a plurality of components with differing temperature characteristics and in addition they involve two or more independent electrical circuits which are often sourced from different power supplies operating at different potentials. In the past, temperature compensation of optically isolated devices has been limited to selection of external current limiting components having inherent temperature variations which compensate to some degree for the temperature variation of the optically isolated device and by accepting a reduced temperature range for operation.

In addition, many applications may also operate over a wide range of voltages which implies a need for a low voltage drop through the current source. For example, a solid state relay application must operate with voltages ranging from 3 to 32 volts. In order for the relay to operate at the low end of this range, a current source must have a voltage drop of 1.5 volts or less.

SUMMARY OF THE INVENTION

Briefly stated, the present invention provides a current source which is readily adjusted solely by alteration of the values of internal components to a specific positive, negative or minimal temperature coefficient. The current source may also be adjusted to allow a specific current flow at any one temperature. The temperature coefficient of the current source is readily and accurately adjusted to offset the temperature variation inherent in a load device so as to produce combined operating characteristic that is essentially unchanged with temperature. The current source may be mounted on a common conductor or substrate with the light emitter in an electro-optical device or system, so that thermal feedback from the light source is optimized. The current source may be applied to a complex load which includes a plurality of components whose operation varies with temperature. The current source is thermally coupled to the complex load and the current source is adjusted to provide compensation for the entire system's variation with temperature. The current source provided by this invention has an especially low internal voltage drop making the current source suitable for use with a low supply voltage, while at the same time providing a current limiting action which makes the current source suitable for use with a high supply voltage.

BRIEF DESCRIPTION OF THE DRAWINGS

FIG. 1 illustrates the use of a resistor as a current limiting device for an electro-optical device according to the prior art;

FIG. 2 illustrates the use of a field effect transistor as a constant current source for an electro-optical device according to the prior art;

FIG. 3 is a schematic diagram of a current source as a preferred embodiment of this invention;

FIG. 4 and FIG. 5 are graphs helpful in understanding the present invention;

FIG. 6 is a schematic diagram of an optically coupled triac using a current source according to the present invention; and FIG. 7 is a graphical representation of the current required to trigger a typical optically coupled triac such as illustrated in FIG. 6.

DETAILED DESCRIPTION OF THE DRAWINGS

FIG. 1 depicts a resistor 10 used as a current limiting device for a light emitting device 11 according to the prior art. Resistor 10 serves to allow a specific current flow through light emitting device 11 for any given voltage. The light intensity produced varies with applied voltage and with temperature as a function of the composite temperature characteristics of light emitting device 11 and resistor 10. This circuit has the advantage of simplicity, but can tolerate only a relatively narrow range of voltage and temperature variation before light emitting device 11 produces no light due to lack of current or is destroyed due to excessive current. The only temperature compensation provided is the inherent temperature related characteristics cf resistor 10.

FIG. 2 depicts a field effect transistor 12 used as a constant current source for light emitting device 11 according to the prior art. Field effect transistor 12 is operated in saturated mode which has the effect of limiting the current flow through light emitting device 11 thus allowing a greater range of voltage and temperature compared to the circuit which used resistor 10 (FIG. 1), without damaging light emitting device 11.

This approach still has the disadvantage that the light output varies with temperature according to the composite characteristics of light emitting device 11 and field effect transistor 12. The only temperature compensation is provided by the inherent temperature related characteristics of field effect transistor 12. In addition the pinchoff voltage of field effect transistor 12 precludes reliable operation with very low voltage input.

The prior art includes numerous variations of the two approaches illustrated in FIG. 1 and FIG. 2, all of which attempt to produce a satisfactory temperature compensation based on some composite of the inherent temperature related characteristics of a combination of these basic current sourcing devices. These approaches all share a number of disadvantages including an adjustment capability which is limited by the selection of devices used in the current source. Practical components allow only a limited range of temperature compensation to be achieved, and it is difficult to adjust the intrinsic temperature characteristics of an individual component to closely match a desired temperature characteristic. What is needed is a scheme which allows the temperature compensation to be adjusted by altering the values of components rather than by attempting to alter the inherent characteristics of the components themselves.

FIG. 3 depicts a current source with adjustable temperature compensation which may be adjusted solely by variation of internal component values, as a preferred embodiment of this invention. A load requiring compensation may be thermally coupled to the current source to ensure that temperature variations of the load are shared with the current source. In this embodiment of the invention, a positive voltage terminal 16 is coupled to a positive voltage supply (not shown), and a negative voltage terminal 17 is coupled to a negative voltage supply (not shown).

A current source 34 is constructed according to the method found on page 76 of "Analogue IC Design: the current mode approach", edited by C. Tomazou et al, copyright 1990 by Peter Peregrinous Ltd., London, United Kingdom. Current source 34 has the property that the current flow through the output transistor can be made almost entirely dependent on the design of the internal components and the temperature coefficient of the output current made dependent on the relative sizes of the transistors comprising the circuit. Current source 34 is designed having an NPN transistor 36 with an emitter area which is 4 times the sizes of each of the emitter areas of an NPN transistor 35, an NPN transistor 37 and an NPN transistor 38.

In a preferred embodiment of this invention the emitter of transistor 36 is coupled to a negative voltage terminal 17 through a resistor 40. The collector of transistor 36 is coupled to the emitter of transistor 35 and to the base of transistor 38. The base of transistor 35, together with the base and collector of transistor 37 are coupled to positive supply terminal 16 through a resistor 39. Resistor 39 supplies a primary biasing current to current source 34, a current flow which is essential to operation of current source 34. The emitter of transistor 37, the base of transistor 36 and the collector of a transistor 38 are coupled together. The emitter of transistor 38 is coupled to negative voltage terminal 17.

A network 28, a modified current mirror circuit, is used as a first current temperature compensation linearization network by altering the mirroring characteristics of the circuit with temperature variation. A resistor 31 couples positive voltage terminal 16 to the emitter of a PNP transistor 29. A resistor 30 couples positive voltage terminal 16 to the emitter of a PNP transistor 32. The base of transistor 29, the base of transistor 32, and the collector of transistor 32 are all coupled to the collector of transistor 35. The ohmic value of resistor 30 is one half the ohmic value of resistor 31 so the current flowing through the emitter of transistor 32 is approximately double the current flowing through the emitter of transistor 29. The variation of these currents with temperature will also differ as a function of this ratio. Further temperature compensation is provided by resistors 30 and 31 manufactured to have relatively large positive temperature coefficients serving to offset the negative temperature coefficients of transistors 29 and 32. The output current from network 28 flows from the collector of transistor 29 and is coupled to the base of an NPN current shunt element 22, and to the collector of an NPN transistor 27.

The output current sourced from the collector of transistor 29 is available as base drive for shunt element 22. As the voltage applied to positive supply terminal 16 is increased, the current supplied to the base of shunt element 22 increases to a level determined by the output current of current source 34 through network 28. This generates an emitter current in shunt element 22, and thereby a proportional collector current in shunt element 22 that is available as input current for a network 45.

Network 45 acts as a current sensing circuit. The collector of shunt element 22 and the base of a PNP transistor 21 are coupled together and are coupled to positive voltage terminal 16 by a current monitoring resistor 18. A resistor 19 couples the emitter of transistor 21 to positive voltage terminal 16. The collector current of shunt element 22 establishes a voltage across resistor 18. As the collector current of shunt element 22 increases, the voltage across resistor 18 also increases. As this voltage increases, transistor 21 begins to source current at a level that is determined by the ohmic values of resistors 18 and 19. This current is applied to the input of a network 24, which is a modified current mirror circuit similar to network 28.

Network 24 is used as a second current temperature compensation linearization network to modify the current level and temperature coefficient of the current sourced from the collector of transistor 21. A resistor 33 couples negative voltage terminal 17 to the emitter of an NPN transistor 26. A resistor 25 couples negative voltage terminal 17 to the emitter of transistor 27. The base of transistor 27, the base of transistor 26, and the collector of transistor 26 are each coupled together and are also coupled to the collector of transistor 21. The ohmic value of resistor 25 is 3 times as large as the ohmic value of resistor 33 so the current flowing through the emitter of transistor 27 is approximately one third the current flowing through the emitter of transistor 26. The variation of these currents with temperature will also differ as a function of this ratio. Further temperature compensation is provided by resistor 25, manufactured to have a relatively large positive temperature coefficient when compared with resistor 33, which is manufactured to have a significantly lower positive temperature coefficient.

The output of network 24, a current sink, is connected to the base of shunt element 22 and the collector of transistor 29. This node acts as a summing node, and when the feedback control loop, comprised of networks 45 and 24,and shunt element 22, is in balance, the current sourced by network 28 minus the current sunk by network 24 equals the input current necessary to establish the desired current in the emitter of shunt element 22. This current level is set by the ohmic value of resistor 18. Since this establishes the base-emitter voltage of transistor 21 and the voltage across resistor 19, this establishes the current applied to the input of network 24, thereby establishing the current feedback path to the base of shunt element 22. The ohmic value of resistor 18 thus serves as the primary means to determine the magnitude of the current passing through shunt element 22 at any one temperature.

The current flowing in the collector of shunt element 22 has a temperature coefficient determined by the temperature characteristics of the feedback control loop. The voltage across resistor 18 establishes the emitter-base potential of transistor 21, and the voltage across resistor 19. Consequently, the temperature coefficient of the voltage across resistor 18 determines the summation of the temperature coefficients of the emitter-base potential of transistor 21, and the voltage across resistor 19.

As stated above, the voltage established across resistor 18 establishes the current sourced by transistor 21. Since resistor 18 is manufactured having a very small temperature coefficient, the temperature coefficient of the current sourced by transistor 21 is determined by the resultant temperature coefficient of the voltage across resistor 19. Resistor 19 is manufactured to have a large positive temperature coefficient which is used to offset the inherent negative temperature coefficient of the emitter-base potential of transistor 21. The magnitude of the resultant temperature coefficient of the voltage across resistor 19 is dependent on the ohmic value of resistor 19. This then establishes the temperature coefficient of the current sourced by transistor 21, and thus serves as the primary means of establishing the temperature coefficient of the feedback control loop.

The result of this feedback is a current flowing through the emitter of current shunt element 22 whose magnitude and variation with temperature is adjusted based on the values of resistors 18 and 19. The emitter of current shunt element 22 supplies the current to a load terminal 20. A load terminal 23 is coupled to negative voltage terminal 17. Thus the temperature compensated current flowing through shunt element 22 will be supplied to a load connected between terminals 20 and 23. The load can be any device requiring a temperature compensated current.

In the embodiment which is illustrated in FIG. 3 the load is a light emitting diode 15 (LED). Typically light emitting diode 15 is thermally coupled to the current source by means of a common mounting tab. This embodiment of the invention provides a temperature compensated light source where the light output intensity of light emitting diode 15 is adjusted to have a desired positive, negative or minimal temperature coefficient. This embodiment of the invention is useful as a means of providing a voltage activated light source with a predetermined temperature coefficient. The internal voltage drops of this embodiment of the invention are low enough to ensure reliable operation of light emitting diode 15 even with voltages of less than than 3 volts applied between positive voltage terminal 16 and negative voltage terminal 17.

An alternative embodiment of the invention couples load terminals 20 and 23 together. An external load is then coupled in series either between the positive supply means and positive voltage terminal 16 or between the negative supply means and negative voltage terminal 17.

Yet another embodiment of the invention, also illustrated in FIG. 3, adds a control input 41 and a buffer network 43 which can be used to switch the current through shunt element 22 to substantially zero, even though the voltage between terminals 16 and 17 is greater than the minimum required for operation of the current source and load device. Buffer network 43 comprises the collector of a PNP transistor 42 coupled to negative voltage terminal 17. The emitter of transistor 42 is coupled to the input of current source 34 at the base-collector of transistor 37. The base of transistor 42 is coupled to control input 41. If a control voltage input is desired, the base of transistor 42 is coupled to the collector of transistor 42 through a resistor 44. If a voltage more negative than the switching voltage is applied to control input 41 then transistor 42 is enabled. This will allow current to flow between the emitter and the collector of transistor 42 from resistor 39, shutting off the current flow to current source 34 from resistor 39. This will shut off current flow between the collector of transistor 35 and network 28, which in turn shuts off the current from network 28 to the base of current shunt element 22. Without a base current, shunt element 22 will not supply current to a load device connected to load terminal 20. On the other hand, if a control voltage significantly more positive than the switching voltage of transistor 42 is coupled to control input 41 then transistor 42 passes no current, and current source 34 is allowed to operate as if buffer network 43 was not present.

Alternatively if control by a means such as an open collector circuit is desired, the base of transistor 42 is coupled to the emitter of transistor 42 through a resistor 46 (shown in phantom). Either resistor 44 or resistor 46 will be used depending upon the desired operation, but resistors 44 and 46 are not used simultaneously. When resistor 46 is used, buffer network 43 is enabled by a control means allowing current to flow from control input 41 to negative voltage terminal 17. If no such current flows then buffer network 43 is disabled and current source 34 operates as if buffer network 43 was not present.

FIG. 4 is a graphical representation of the relationship between the temperature coefficient of the embodiment of the invention illustrated in FIG. 3 and the corresponding ohmic value required for resistors 18 and 19 (FIG. 3) at a temperature of 25 degrees C. when adjusted to produce a current flow through the load means of approximately 5 ma at 25 degrees C. This represents the effect seen when the ohmic values of resistor 18 and of resistor 19 alone are altered and the temperature coefficients of all components comprising the embodiment of FIG. 3 are unchanged. The graph plots ambient temperature as the abscissa and current flow through a load connected between terminals 20 and 23 (FIG. 3) as the ordinate. A curve 61 represents the negative temperature coefficient obtained with resistor 18 having an ohmic value of 156 ohms, and resistor 19 having an ohmic value of 641 ohms. A curve 62 represents the approximately zero temperature coefficient obtained with resistor 18 having an ohmic value of 183 ohms, and resistor 19 having an ohmic value of 1500 ohms. A curve 63 represents the positive temperature coefficient obtained with resistor 18 having an ohmic value of 274 ohms, and resistor 19 having an ohmic value of 4500 ohms.

FIG. 5 represents the same information as FIG. 4 except that the current flow through the load means is adjusted to approximately 10 ma at 25 degrees C. A curve 64 represents the negative temperature coefficient obtained with resistor 18 having an ohmic value of 66 ohms, and resistor 19 having an ohmic value of 641 ohms. A curve 66 represents the approximately zero temperature coefficient obtained with resistor 18 having an ohmic value of 76 ohms, and resistor 19 having an ohmic value of 2254 ohms. A curve 67 represents the positive temperature coefficient obtained with resistor 18 having an ohmic value of 96 ohms, and resistor 19 having an ohmic value of 6600 ohms.

The temperature characteristics illustrated in FIG. 4 and FIG. 5 serve to illustrate the typical range of compensation that is available by means of this circuit. This range is adequate to allow compensation of a variety of components including typical light emitting diodes which have light intensity versus temperature variations which are in the range of −0.5% per degree C. to −2.8% per degree C.

FIG. 6 is a schematic diagram of an optically coupled triac using a current source 52 according to the present invention. An activating voltage is applied between a terminal 47 and a terminal 48 to trigger a triac 53 connected between terminals 49 and 50. The current passing between terminals 47 and 48 through a light emitting diode 51 is regulated by current source 52 as one embodiment of this invention. When a voltage is applied between terminals 47 and 48, a current will flow causing light emitting diode 51 to emit light which is coupled to optically triggered triac 53. When the current flow reaches a point where sufficient light is generated to trigger optically triggered triac 53, current is allowed to pass between terminals 49 and 50. When an insufficient voltage is applied between terminals 47 and 48 to produce sufficient light to trigger optically triggered triac 53 there is no current flow between terminals 49 and 50. It is the function of current source 52 to allow enough current to flow to ensure triggering of optically triggered triac 53 without allowing an excessive current flow under any circumstances. Current source 52, light emitting diode 51, optically triggered triac 53 are thermally coupled together.

FIG. 7 is a graphical representation of the current required to trigger a typical optically coupled triac illustrated in FIG. 6. The graph plots ambient temperature in degrees C. as the abscissa and a relative current through the light emitting device as the ordinate. The ordinate scale has been adjusted so the current values shown are relative to the current at 25 degrees C. which is shown as 1.00. A curve 54 represents the minimum current which must flow between terminals 47 and 48 (FIG. 6) for the optically coupled triac 53 (FIG. 6) to trigger into an on state for temperatures ranging from −40 degrees C. to +80 degrees C.

A line 56 represents the minimum current which must be supplied by a source of current that remains constant with temperature. The level of current flow is set to ensure operation at the lowest temperature of −40 degrees C. Since the current required at a higher temperature decreases there is excessive current at higher temperatures where light emitting diode 51 (FIG. 6) is less able to tolerate excessive current flow. At a temperature of +80 degrees C. light emitting diode 51 (FIG. 6) receives approximately 40% more current than required to assure triggering. A line 57 represents the prior art wherein some temperature compensation is provided, but the temperature compensation of the current source cannot be matched closely with the temperature variation of curve 54, still resulting in excessive current at 80 degrees C. A line 58 represents the temperature compensation provided by an adjustable current source as a preferred embodiment of this invention. Temperature compensation of current source 52 (FIG. 6) has been adjusted to closely match the temperature variation of curve 54 resulting in minimal excess current at 80 degrees C.

It should be apparent that the current source of the present invention having an easily adjustable temperature coefficient is well suited to compensate for performance variations due to temperature in a wide variety of electrical devices and that the technique is uniquely suited to the temperature compensation requirements of electro-optical devices such as an optically coupled triac device. The current source can be adjusted to supply a current having a positive, negative or even a constant (e.g. approximately zero) temperature coefficient.

We claim:

1. A temperature compensated system, comprising:

load means in which a critical operating characteristic varies in proportion to variation of temperature and a controlling current;

a current source which supplies a controlling current to the load means;

a first resistive means coupled to the current source, the first resistive means having a predetermined positive temperature coefficient; and a second resistive means coupled to the current source, the second resistive means having a predetermined positive temperature coefficient larger than the temperature coefficient of the first resistive means, the first and second resistive means being coupled to the current source in such a way that the temperature coefficient of the current source is adjusted solely by variation of the first and the second resistive means, and the variation due to temperature of the controlling current supplied by the current source allows variation due to temperature of the critical operating characteristic to be minimized or adjusted to a desired positive or negative value.

2. A temperature compensated system comprising:

an optically triggered semiconductor switching device controlled by a current operated light emitter having a light output intensity which itself is controlled by a controlling current; and a current source which supplies the controlling current to the current operated light emitter, the current source having a temperature coefficient which is adjusted solely by variation of internal component values, the optically triggered semiconductor switching device being thermally coupled to the current source, and wherein the current source is adjusted to vary the controlling current provided to the current operated light emitter so that the controlling current supplied to the current operated light emitter is the minimum required for activating the optically triggered semiconductor switching device regardless of temperature.

3. A current source with adjustable temperature compensation which may be adjusted solely by variation of internal component values, comprising:

a first resistor with a predetermined positive temperature coefficient, having a first terminal connected to a first voltage supply terminal, and also having a second terminal;

a second resistor with a predetermined positive temperature coefficient larger than the temperature coefficient of the first resistor, the second resistor having a first terminal connected to the first voltage supply terminal, and also having a second terminal;

an output means having a first terminal and a second terminal connected to a second voltage supply terminal;

a current shunt element having a first current carrying electrode, a control electrode, and a second current carrying electrode coupled to the first terminal of the output means;

enabling means, electrically coupled to the control electrode, which serves to supply the control electrode of the current shunt element with an enabling current;

a current control transistor of a first junction polarity, having abase electrode coupled to both the second terminal of the first resistor and to the first current carrying electrode of the current shunt element, an emitter electrode coupled to the second terminal of the second resistor, and a collector electrode; and collector supply means, electrically coupled to the collector electrode, which serves to supply the collector electrode of the current control transistor with a current having a predetermined temperature coefficient.

4. The current source according to claim 6 wherein the collector supply means comprises:

a positive temperature coefficient current source having transistors of a second junction polarity, an output terminal, a second terminal coupled to the first voltage supply terminal through a resistive device, and a third terminal conducted to the second voltage supply terminal;

a first current temperature compensation linearization network having transistors of the first junction polarity, an input terminal coupled to the output terminal of the positive temperature coefficient current source, an output terminal, and a power terminal coupled to the first voltage supply terminal;

a second current temperature compensation linearization network having transistors of the second junction polarity, an input terminal coupled to the output terminal of the first current temperature compensation linearization network, an output terminal coupled to the collector electrode of the current control transistor, and a power terminal coupled to the second voltage supply terminal.

5. The current source according to claim 4 wherein the enabling means to supply an enabling current to the control electrode of the current shunt element comprises the control electrode of the current shunt element being coupled to the output terminal of the first current temperature compensation linearization network.

6. The current source according to claim 3 further including:

said enabling means responsive to a logic input for disabling the current shunt element.

7. The current source according to claim 3 wherein the first and second terminals of the output means are both connected to the second voltage supply terminal and an external load means is connected in series between either a first supply means and the current source or a second supply means and the current source.

8. The current source according to claim 3 wherein the output means comprises:

a current activated light emitter and wherein the current source is adjusted to vary the current provided to the current activated light emitter so as to produce a light intensity which is constant above a threshold voltage and the light intensity further has a variation with temperature which may be minimized or adjusted to a desired positive or negative value by adjusting component values within the current source.

9. The current source according to claim 3 further comprising:

an optically excited semiconductor switching device which is optically coupled to a current activated light emitter and wherein the current source is adjusted to vary the current provided to the current activated light emitter to be the minimum required to activate the optically excited semiconductor switching device regardless of temperature.

10. A voltage operated optical system comprising:

a current activated light emitter having an activated current;

a current source coupled to the current activated light emitter and which regulates the activating current so as to produce a light output intensity which is constant above a threshold voltage and the light output intensity further has a variation with temperature which may be minimized or adjusted to a desired positive or negative value; and an optically excited semiconductor switching device which is thermally and optically coupled to the current activated light emitter and wherein the activating current is regulated by the current source so the activating current is essentially constant regardless of voltage above a threshold voltage and is the minimum required to activate the optically excited semiconductor switching device regardless of temperature.

11. A method for adjusting the variation of operation of a system with respect to temperature comprising:

providing a plurality of components which together comprise a system, having at least one current operated light emitter having a light output which is adjusted by variation of a control current supplied to the current operated light emitter;

providing a current source, electrically coupled to the current operated light emitter in such a way as to supply the control current to the current operated light emitter, the control current having a temperature coefficient which is adjusted to have a desired positive or negative variation with temperature solely by variation of internal component values;

providing an optically triggered semiconductor switching device which is controlled by the current operated light emitter;

thermally coupling the optically triggered semiconductor switching device to the current source; and adjusting the temperature coefficient of the current source to vary the current provided to the current operated light emitter such that the current supplied to the current operated light emitter is the minimum required to ensure reliable triggering of the optically triggered semiconductor switching device over a predetermined temperature range.

* * * * *

UNITED STATES PATENT AND TRADEMARK OFFICE
CERTIFICATE OF CORRECTION

PATENT NO. : 5,198,701 Page 1 of 3

DATED : March 30, 1993

INVENTOR(S) : Robert B. Davies Et Al.

It is certified that error appears in the above-identified patent and that said Letters Patent is hereby corrected as shown below:

In the drawings, Figs. 4, 5, 6 and 7, should appear as shown on the attached pages.

Column 9, line 16, (claim 4) please change "claim 6" to --claim 3--.

Signed and Sealed this

Fifteenth Day of March, 1994

*Attest:*

BRUCE LEHMAN

*Attesting Officer*

*Commissioner of Patents and Trademarks*

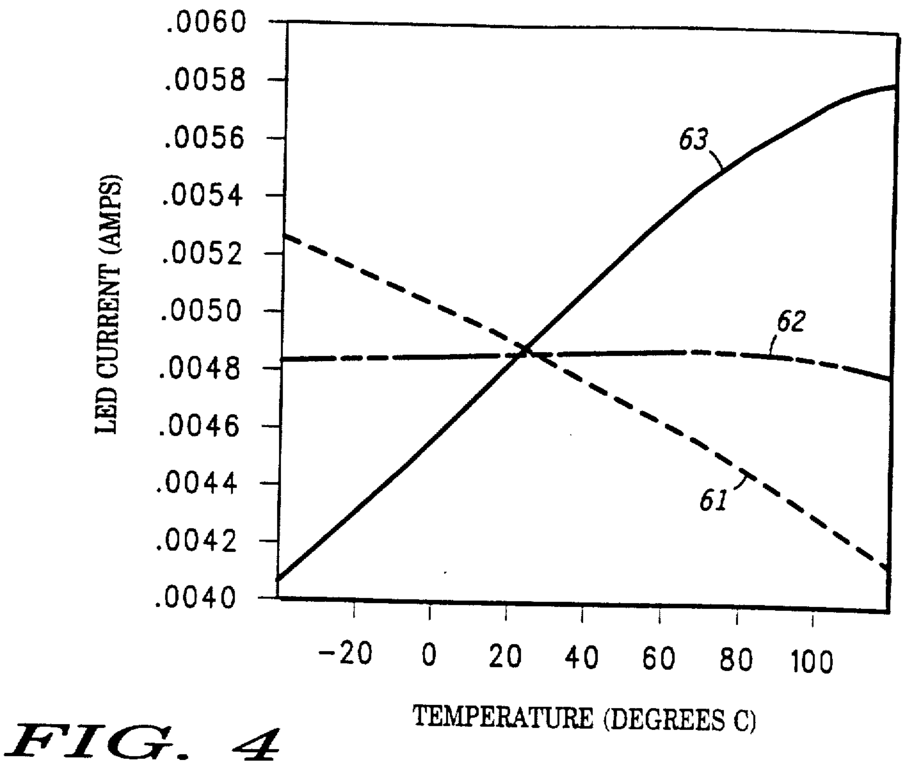
FIG. 4
FIG. 5
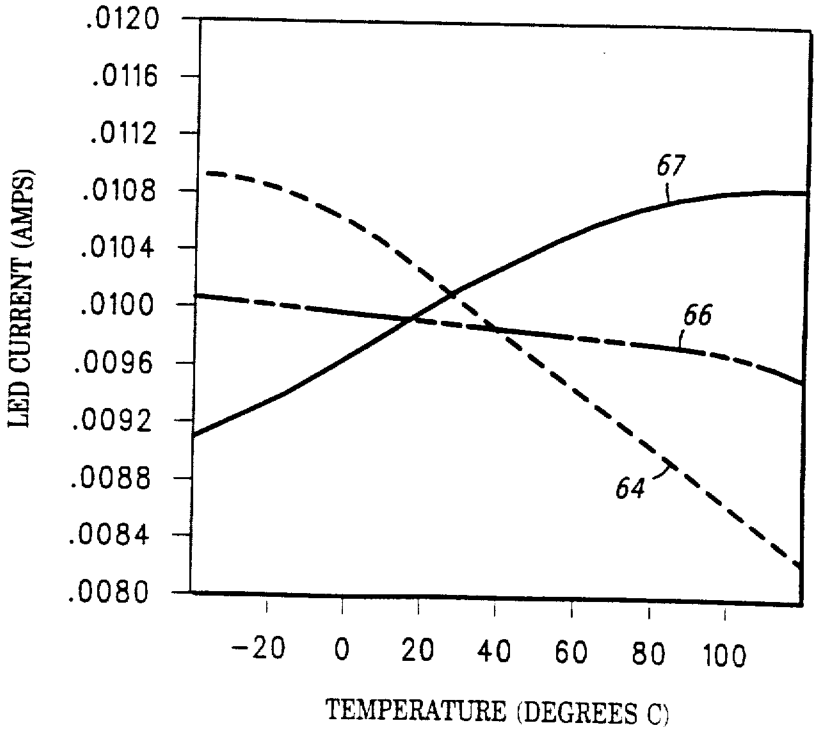

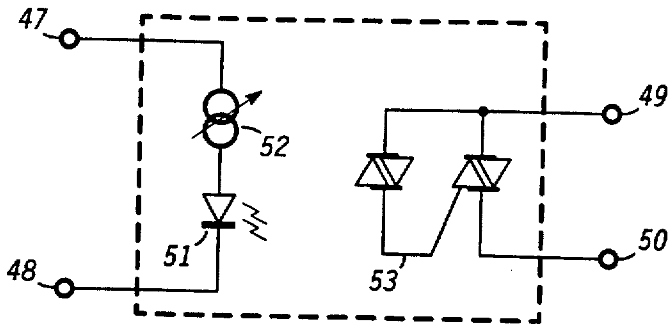
FIG. 6
FIG. 7
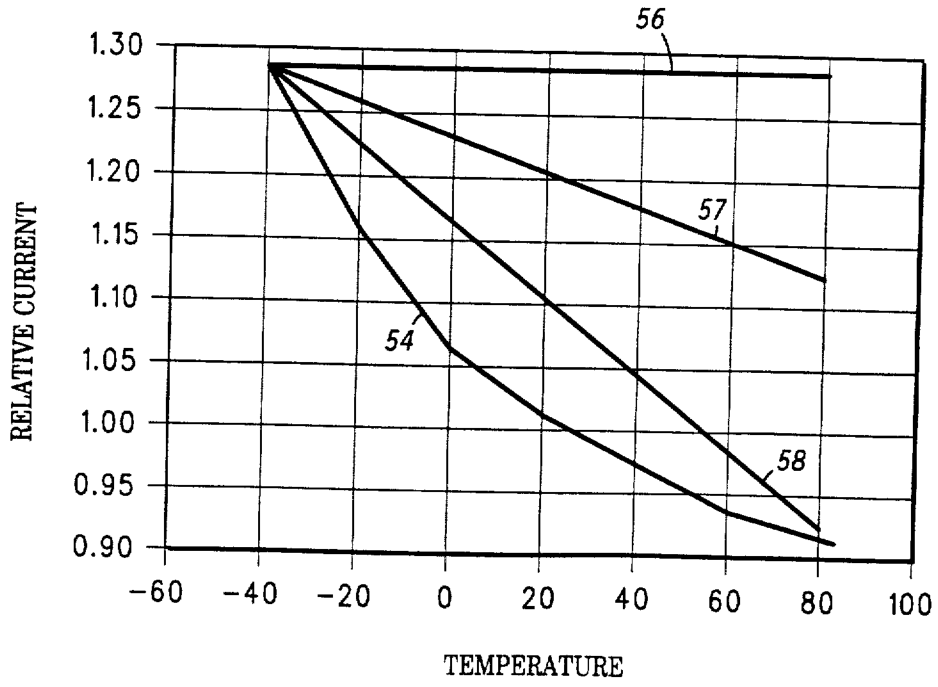

UNITED STATES PATENT AND TRADEMARK OFFICE

CERTIFICATE OF CORRECTION

PATENT NO. : 5,198,701

DATED : March 30, 1993

INVENTOR(S) : Robert B. Davies et al

It is certified that error appears in the above-indentified patent and that said Letters Patent is hereby corrected as shown below:

On the title page, after item [76] Inventors: insert the following;

--[73] Assignee: Motorola, Inc., Schaumburg, IL--.

Signed and Sealed this

Twenty-sixth Day of April, 1994

Attest:

BRUCE LEHMAN

Attesting Officer

*Commissioner of Patents and Trademarks*